US008502296B1

(12) United States Patent
Labonte et al.

(10) Patent No.: US 8,502,296 B1
(45) Date of Patent: Aug. 6, 2013

(54) NON-VOLATILE MEMORY CELL WITH ASYMMETRICAL SPLIT GATE AND RELATED SYSTEM AND METHOD

(75) Inventors: Andre P. Labonte, Scarborough, ME (US); Jiankang Bu, Windham, ME (US); Mark Rathmell, Scarborough, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 853 days.

(21) Appl. No.: 12/217,539

(22) Filed: Jul. 7, 2008

(51) Int. Cl.
*H01L 29/788* (2006.01)

(52) U.S. Cl.
USPC .......... 257/316; 257/315; 257/E21.682; 257/E21.645; 257/E21.68; 257/365

(58) Field of Classification Search
USPC .......... 247/315, 316, 365, E21.682, E21.645, 247/E21.68
See application file for complete search history.

(56) References Cited

U.S. PATENT DOCUMENTS

| | | | |
|---|---|---|---|
| 5,242,848 A | 9/1993 | Yeh | |
| 5,369,609 A | 11/1994 | Wang et al. | |
| 6,313,498 B1 | 11/2001 | Chen | |
| 6,700,600 B1 * | 3/2004 | Sandstrom et al. | 347/256 |
| 6,838,343 B2 * | 1/2005 | Hung et al. | 438/257 |
| 6,979,857 B2 | 12/2005 | Forbes | |
| 7,057,228 B2 | 6/2006 | Chih et al. | |
| 7,242,051 B2 | 7/2007 | Widjaja et al. | |
| 7,247,907 B2 | 7/2007 | Gao et al. | |
| 2003/0034517 A1 * | 2/2003 | Chen | 257/315 |

OTHER PUBLICATIONS

F. Matsuoka et al., "Drain Avalanche Hot Hole Injection Mode on PMOSFETs," 1988 IEEE, 4 pages.
Yanjun Ma et al., "Reliability of pFET EEPROM With 70-Å Tunnel Oxide Manufactured in Generic Logic CMOS Processes," IEEE Transactions on Device and Materials Reliability, vol. 4, No. 3, Sep. 2004, pp. 353-358.
L. Chang et al., "Non-volatile memory device with true CMOS compatibility," Electronics Letters, Aug. 19, 1999, vol. 35, No. 17, pp. 1443-1445.
Nelson S. Saks et al., "Observation of Hot-Hole Injection in NMOS Transistors Using a Modified Floating-Gate Technique," IEEE Transactions on Electron Devices, vol. ED-33, No. 10, Oct. 1986, pp. 1529-1534.

(Continued)

*Primary Examiner* — Long Pham
(74) *Attorney, Agent, or Firm* — Eugene C. Conser; Wade J. Brady, III; Frederick J. Telecky, Jr.

(57) ABSTRACT

A method includes forming at least one control gate over a semiconductor substrate. The method also includes depositing a layer of conductive material over the at least one control gate and the semiconductor substrate. The method further includes etching the layer of conductive material to form multiple spacers adjacent to the at least one control gate, where at least one of the spacers forms a floating gate in at least one memory cell. Two spacers could be formed adjacent to the at least one control gate, and one of the spacers could be etched so that a single memory cell includes the control gate and the remaining spacer. Also, two spacers could be formed adjacent to the at least one control gate, and the at least one control gate could be etched and separated to form multiple control gates associated with different memory cells.

20 Claims, 4 Drawing Sheets

OTHER PUBLICATIONS

David Sowards, "Non-Volatile Memory: The principles, the technologies, and their significance to the smart card integrated circuit," 1999 Emosyn and Silicon Storage Technology, pp. 1-13.

T.I. Wu et al., "Characterization of Split Gate Flash Memory Endurance Degradation Mechanism", Proceedings of the 11th IPFA 2004, Taiwan, pp. 115-117.

Jiankang Bu, "Low Power, CMOS Compatible Non-Volatile Memory Cell and Related Method and Memory Array", U.S. Appl. No. 11/904,515, filed Sep. 27, 2007.

Jiankang Bu, et al., "System and Method for Providing Low Cost High Endurance Low Voltage Electrically Erasable Programmable Read Only Memory", U.S. Appl. No. 11/515,215, filed Sep. 1, 2006.

Jiankang Bu, et al., "System and Method for Providing Low Voltage High Density Multi-Bit Storage Flash Memory", U.S. Appl. No. 11/437,564, filed May 19, 2006.

* cited by examiner

NON-VOLATILE MEMORY CELL WITH ASYMMETRICAL SPLIT GATE AND RELATED SYSTEM AND METHOD

TECHNICAL FIELD

This disclosure is generally directed to memory cells and more specifically to a non-volatile memory cell with an asymmetrical spit gate and related system and method.

BACKGROUND

Conventional non-volatile memory (NVM) cells are routinely used in electronic circuitry, such as electronic consumer devices. Some non-volatile memory cells use "split-gate" designs, where transistors in the memory cells have both a floating gate and a control gate. The floating gate in a transistor is typically located at least partially between the source junction of the transistor and the control gate of the transistor.

Non-volatile memory cells implemented in this manner often suffer from various drawbacks. For example, the source junction often needs to have significant overlap with the floating gate, and the source junction often has to be quite deep in a substrate to tolerate high voltages. This increases the overall size of each transistor and reduces the number of memory cells that can be formed in a given area. Also, the fabrication process is often complicated and requires one or more of the following fabrication features: use of a special injector profile, formation of a very thick oxide layer between the floating and control gates, formation of a buried high-voltage source junction that is not self-aligned to the floating gate, and formation of thick gate oxides under the floating gate and control gate. Each of these may increase the cost of the memory cells being formed.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 6, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
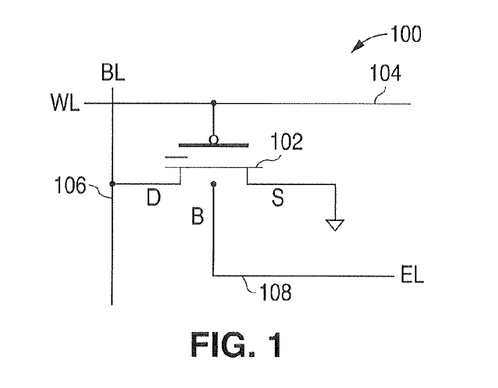
FIG. 1 illustrates an example non-volatile memory cell according to this disclosure.

FIG. 1 illustrates an example non-volatile memory cell 100 according to this disclosure. The embodiment of the memory cell 100 shown in FIG. 1 is for illustration only. Other embodiments of the memory cell 100 could be used without departing from the scope of this disclosure.

As shown in FIG. 1, the memory cell 100 includes a transistor 102, a word line (WL) 104, a bit line (BL) 106, and an erase line (EL) 108. In this example, the transistor 102 is shown as having a "split-gate" design, meaning it has two gate structures (namely a floating gate and a control gate). The floating gate of the transistor 102 is used for charge storage and is "floating" since it is not coupled to any known potential. The control gate of the transistor 102 is coupled to the word line 104. The transistor 102 also has its drain coupled to the bit line 106, its source coupled to ground, and its substrate (bulk) coupled to the erase line 108.

During a programming operation, the write line 104 can receive a positive voltage (such as +5V), and the bit line 106 can receive a negative voltage (such as −5V). Also, the source of the transistor 102 is grounded, and the bulk of the transistor 102 can be grounded through the erase line 108. In this situation, the drain of the transistor 102 is reverse-biased, and hot electron injection can occur due to impact ionization at the drain junction. A positive floating gate potential draws electrons onto the floating gate (thereby storing a charge on the floating gate). This could be done, for example, to program the memory cell 100 to a memory state of "1."

During an erase operation, a voltage can be applied to the bulk of the transistor 102 through the erase line 108, such as a +12V signal for a 120 Å gate oxide in the transistor 102. This discharges electrons from the floating gate to the substrate via Fowler-Nordheim tunneling (thereby removing any charge programmed on the floating gate). This could be done, for example, to force the memory cell 100 into a memory state of "0." If multiple memory cells 100 are located in the same well of the substrate (such as in the same n-well), the memory cells 100 could be erased together at the same time. Moreover, the well of the substrate helps to isolate the memory cell 100 from other active elements on a semiconductor wafer, thereby helping to avoid disturbances to the memory cell 100.

During a read operation, a voltage can be applied to the control gate of the transistor 102 through the write line 104, such as −1V for a −0.5V PMOS threshold voltage transistor. A voltage can also be applied to the drain of the transistor 102 through the bit line 106, such as −1V. The source of the transistor 102 is grounded, and the bulk of the transistor 102 can be grounded through the erase line 108. If the memory cell 100 has been programmed, the floating gate of the transistor 102 is charged with electrons, and a higher current flows through the transistor 102. If the memory cell 100 has been erased (or is not currently programmed), the floating gate of the transistor 102 is not charged with electrons, and little or no current flows through the transistor 102. In this way, a higher or lower current can be measured and used to determine the state of the memory cell 100.

Figure 2:
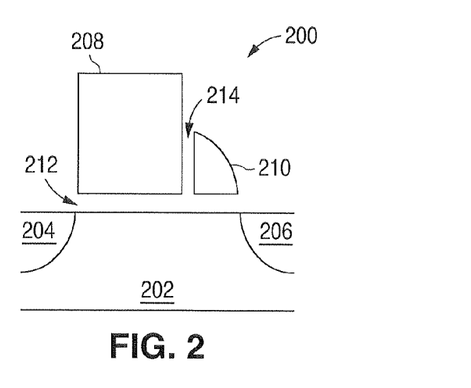
FIG. 2 illustrates a cross-section of an example transistor in a non-volatile memory cell according to this disclosure.

One example embodiment of the transistor 102 is shown in FIG. 2, which is described below. Also as described in more detail below, the floating gate of the transistor 102 is formed as a "stringer" or "spacer" in the transistor 102. For example, after the control gate of the transistor 102 is formed over a substrate, a layer of conductive material (such as polysilicon) can be deposited over the control gate and the substrate. When the layer of conductive material is etched, this creates stringers or spacers (portions of the conductive material that are not removed during etching) around the control gate. The transistor 102 takes advantage of this by using one of the stringers or spacers as the floating gate of the transistor. Additional details regarding the structure of the transistor 102 and techniques for forming one or more transistors 102 are provided below. Each of the lines 104-108 could represent a wire, trace, or other electrically conductive line, such as a back-end metal line formed from aluminum or copper.

Although FIG. 1 illustrates one example of a non-volatile memory cell 100, various changes may be made to FIG. 1. For example, the layout and arrangement of the transistor 102 and the signal lines 104-108 are for illustration only. Also, while described as being in the "1" state when programmed, the memory cell 100 could have a "0" state when programmed. In addition, while shown as a PMOS transistor, the transistor 102 could also represent an NMOS transistor with appropriate connections to the lines 104-108, and the well of the NMOS transistor could be an isolated p-well (IPW) by a deep n-well (DNW).

FIG. 2 illustrates a cross-section 200 of an example transistor in a non-volatile memory cell according to this disclosure. In particular, FIG. 2 illustrates a cross-section 200 of the transistor 102 in the memory cell 100 of FIG. 1. The embodiment of the cross-section 200 shown in FIG. 2 is for illustration only. Memory cells with transistors having other cross-sections could be used without departing from the scope of this disclosure.

As shown in FIG. 2, the transistor 102 is formed in and over a semiconductor substrate 202. The substrate 202 could represent any suitable semiconductor substrate, such as silicon. In particular embodiments, other structures of the transistor 102 are formed in a well of the substrate 202, such as in an n-well formed in the substrate 202. The n-well or other well could be formed in any suitable manner, such as by masking the substrate 202 and performing an implantation to deposit one or more n-type dopants or other dopants in portions of the substrate 202.

A source region 204 and a drain region 206 are formed within the substrate 202. The source and drain regions 204-206 represent areas of the substrate 202 that have been doped with one or more suitable dopants. For example, the source and drain regions 204-206 could represent areas of the substrate 202 (such as within an n-well) that are doped with one or more p+ type or other dopants.

A split-gate is formed over the substrate 202. The split-gate here includes a control gate 208 and a floating gate 210. The control gate 208 is typically coupled to an electrical signal line, such as the write line 104, while the floating gate 210 is floating. As described in more detail below, the control gate 208 could be formed by depositing and etching a layer of conductive material. The floating gate 210 could then be formed by depositing a second layer of conductive material over the control gate 208 and etching the second conductive layer. Due to the presence of the control gate 208 under the second conductive layer being etched, stringers or spacers are formed to the sides of the control gate 208, and a stringer or spacer could be used as the floating gate 210 in the transistor 102 being formed.

In this example, the control and floating gates 208-210 are separated from the substrate 202 by an insulator 212, and the control and floating gates 208-210 are separated from each other by an insulator 214. The insulator 212 may or may not have a different thickness under the control and floating gates 208-210, and the insulator 212 under each gate 208-210 may or may not be formed of a different material and/or deposited separately. The insulators 212-214 are often formed from oxide (such as silicon dioxide) and are often referred to as "gate oxides" of the transistor 102. The insulators 212-214 could be formed from any insulating material(s).

Although FIG. 2 illustrates one example of a cross-section 200 of a transistor in a non-volatile memory cell, various changes may be made to FIG. 2. For example, any other suitable transistor 102 could be used in the non-volatile memory cell 100.

FIGS. 3A through 3E illustrate a first example technique for forming transistors in non-volatile memory cells according to this disclosure. The technique shown in FIGS. 3A through 3E is for illustration only. Other techniques could be used to form transistors in non-volatile memory cells without departing from the scope of this disclosure.

Figure 3A:
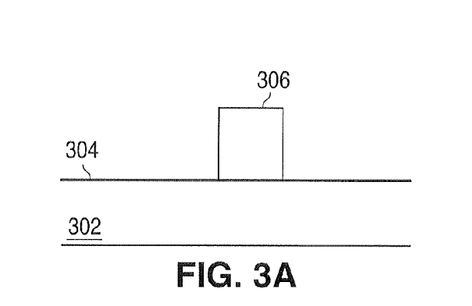
FIGS. 3A through 3E illustrate a first example technique for forming transistors in non-volatile memory cells according to this disclosure.

In FIG. 3A, a substrate 302 has been formed or provided, and an insulating layer 304 has been formed over the substrate 302. The insulating layer 304 could be formed from any suitable material(s) and in any suitable manner, such as by depositing a layer of insulating material or by oxidizing a surface of the substrate 302. A control gate 306 is formed over the insulating layer 304. The control gate 306 could be formed from any suitable material(s) and in any suitable manner. As a particular example, the control gate 306 could be formed by depositing a layer of polysilicon or other conductive material(s) and then patterning and etching the layer to form the control gate 306.

Figure 3B:
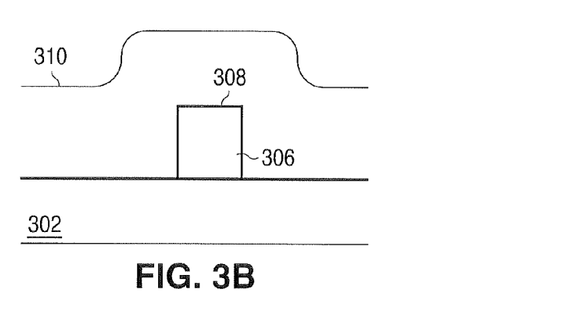

In FIG. 3B, an insulating layer 308 has been formed over the control gate 306. Again, the insulating layer 308 could be formed in any suitable manner, such as by depositing a layer of insulating material or performing an oxidation. Here, the insulating layer 304 could first be removed off of exposed portions of the substrate 302 not covered by the control gate 306 (in which case the insulating layer 308 extends over the substrate 302 as well), or the insulating layer 304 could remain or partially remain (in these two latter cases the insulating layer 308 extends over the control gate 306). Also shown in FIG. 3B is a conductive layer 310, which is deposited over the substrate 302 and the control gate 306. The conductive layer 310 could be formed from any suitable material(s), such as polysilicon. The conductive layer 310 could also be formed in any suitable manner, such as by physical vapor deposition.

Figure 3C:
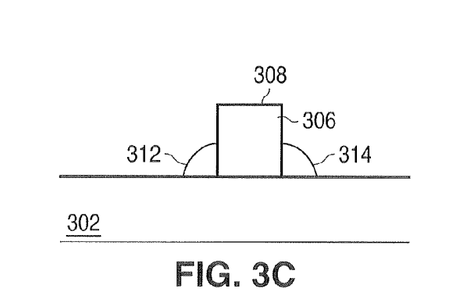

In FIG. 3C, the conductive layer 310 has been etched to form two spacers 312-314 on opposite sides of the control gate 306. The etch performed here could represent an anisotropic poly etch or other etch that is adequately selective to the insulating layer 304/308 (which acts as an etch stop for the etch). The width of the resulting spacers 312-314 may be controlled by the thickness of the conductive layer 310, and the height of the resulting spacers 312-314 may be controlled by the thickness of the control gate 306 and the applied over-etch (if any) performed on the conductive layer 310.

Figure 3D:
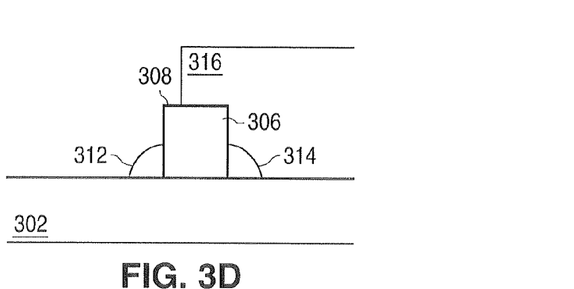

In FIG. 3D, a mask 316 is formed over part or all of the control gate 306 and over one of the spacers 314. The other spacer 312 remains exposed. The mask 316 could be formed from any suitable material(s) and in any suitable manner, such as by depositing and patterning a layer of photoresist or hard mask material.

Figure 3E:
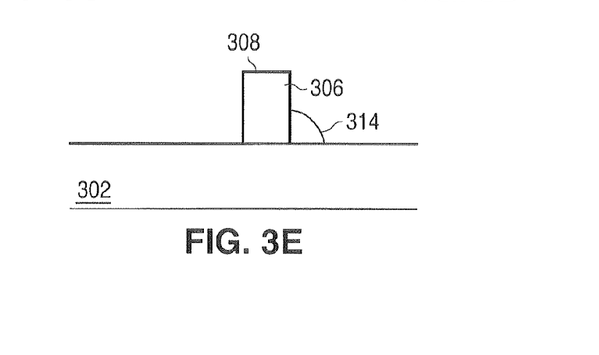

In FIG. 3E, an etch is performed to remove the exposed spacer 312 (and possibly a portion of the control gate 306). The etch could, for example, represent an isotropic poly etch that is adequately selective to the insulating layer 304/308 (which acts as an etch stop). This leads to the creation of an asymmetrical memory cell, where a stringer or spacer remains on one side of the control gate 306 and is used as a floating gate. Other areas of the semiconductor wafer (such as those not being used to form NVM memory cells) may also undergo the isotropic poly etch, which can remove any stringers or spacers so that transistors or other structures in those areas are not degraded. After the etch, the mask 316 can be removed in any suitable manner, and the remaining structures of the transistor 102 (such as the source and drain regions) can be formed.

In some embodiments, the transistor 102 shown here can be formed using conventional complimentary metal oxide semiconductor (CMOS) processes, such as by using the C9T5V CMOS platform from NATIONAL SEMICONDUCTOR CORP. Standard CMOS processes can also be used before and after the formation of the structures shown in FIGS. 3A through 3E.

For some CMOS platforms, the insulating layer 304/308 (such as one or more silicon dioxide layers) may be too thin to guarantee a desired retention for the memory cell (such as at least ten years). In this case, a thicker insulating layer 308 (such as approximately 11 nm or more) could be formed over the control gate 306. This may require an extra mask to remove the thicker insulating layer from other areas of the semiconductor wafer (such as those not used to form NVM memory cells).

Among other things, transistors 102 formed in this manner may not require deep source junctions, special injectors, or source/floating gate overlap. Also, this process may be highly compatible with standard CMOS processes. Further, the memory cell 100 with the transistor 102 is comparable to low-cost CMOS NVM memory cells, but the memory cell 100 can have a performance that is comparable to split-gate flash memory. In addition, the memory cell 100 can employ a highly efficiency programming mechanism, where electrical operation consumes little or no channel current (except for a small reverse-junction leakage current), thereby providing low-voltage and low-power operation.

Although FIGS. 3A through 3E illustrate one example of a technique for forming transistors in non-volatile memory cells, various changes may be made to FIGS. 3A through 3E. For example, the sizes, shapes, and placements of various components are for illustration only. Also, while shown as a sequence of operations, various operations could occur in a different order.

FIGS. 4A through 4E illustrate a second example technique for forming transistors in non-volatile memory cells according to this disclosure. The technique shown in FIGS. 4A through 4E is for illustration only. Other techniques could be used to form transistors in non-volatile memory cells without departing from the scope of this disclosure.

Figure 4A:
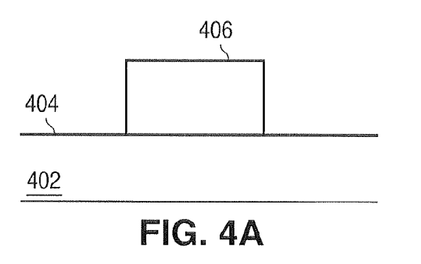
FIGS. 4A through 4E illustrate a second example technique for forming transistors in non-volatile memory cells according to this disclosure.

In FIG. 4A, a substrate 402 has been formed or provided, an insulating layer 404 has been formed over the substrate 402, and a dual control gate 406 has been formed over the insulating layer 404. This may be done in the same or similar manner described above with respect to FIG. 3A. In this example, the dual control gate 406 is larger than the control gate 306 in FIG. 3A because, as described below, the dual control gate 406 is used to form control gates in multiple transistors 102.

Figure 4B:
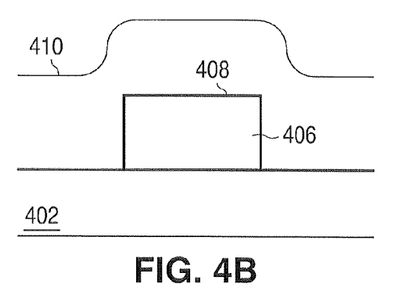
Figure 4C:
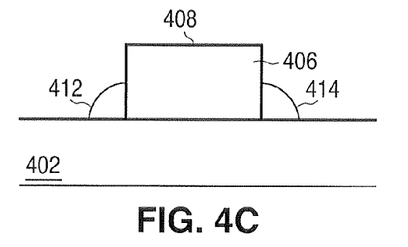

In FIG. 4B, an insulating layer 408 has been formed over the dual control gate 406, and a conductive layer 410 has been deposited over the substrate 402 and the dual control gate 406. This may be done in the same or similar manner described above with respect to FIG. 3B. In FIG. 4C, the conductive layer 410 has been etched to form two spacers 412-414 on opposite sides of the dual control gate 406. This may be done in the same or similar manner described above with respect to FIG. 3C.

Figure 4D:
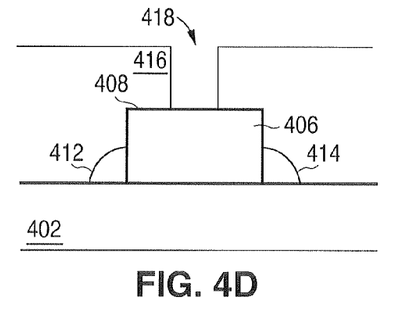

In FIG. 4D, a mask 416 is applied over the dual control gate 406 and both of the spacers 412-414. This may be done in the same or similar manner described above with respect to FIG. 3D, except that the mask 416 is patterned differently. Here, the mask 416 covers both spacers 412-414. The mask 416 also includes an opening 418 through which a portion of the dual control gate 406 is exposed.

Figure 4E:
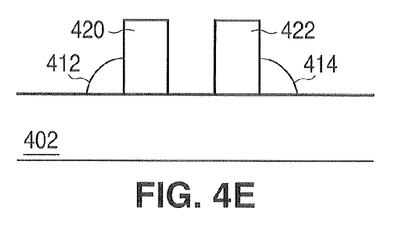

In FIG. 4E, an etch is performed to divide the dual control gate 406 into two separate control gates 420-422. This may be done in the same or similar manner described above with respect to FIG. 3E. This leads to the creation of two transistors, one using the control gate 420 and the floating gate 412 and the other using the control gate 422 and the floating gate 414. During other fabrication steps, a shared source can be formed between the control gates 420-422. In this way, multiple memory cells 100 can be formed with a higher packing density, reducing the size of the memory cells and/or increasing the storage capacity for a given area.

Note that the dual control gate 406 here is large enough to allow the subsequent etch to create two asymmetrical devices. Also note that a subsequent spacer removal etch may be required (as is done in FIG. 3E) to remove any parts of the spacers that could short-circuit the memory cells (and thus help to ensure floating gate isolation).

Although FIGS. 4A through 4E illustrate another example of a technique for forming transistors in non-volatile memory cells, various changes may be made to FIGS. 4A through 4E. For example, the sizes, shapes, and placements of various components are for illustration only. Also, while shown as a sequence of operations, various operations could occur in a different order.

Figure 5:
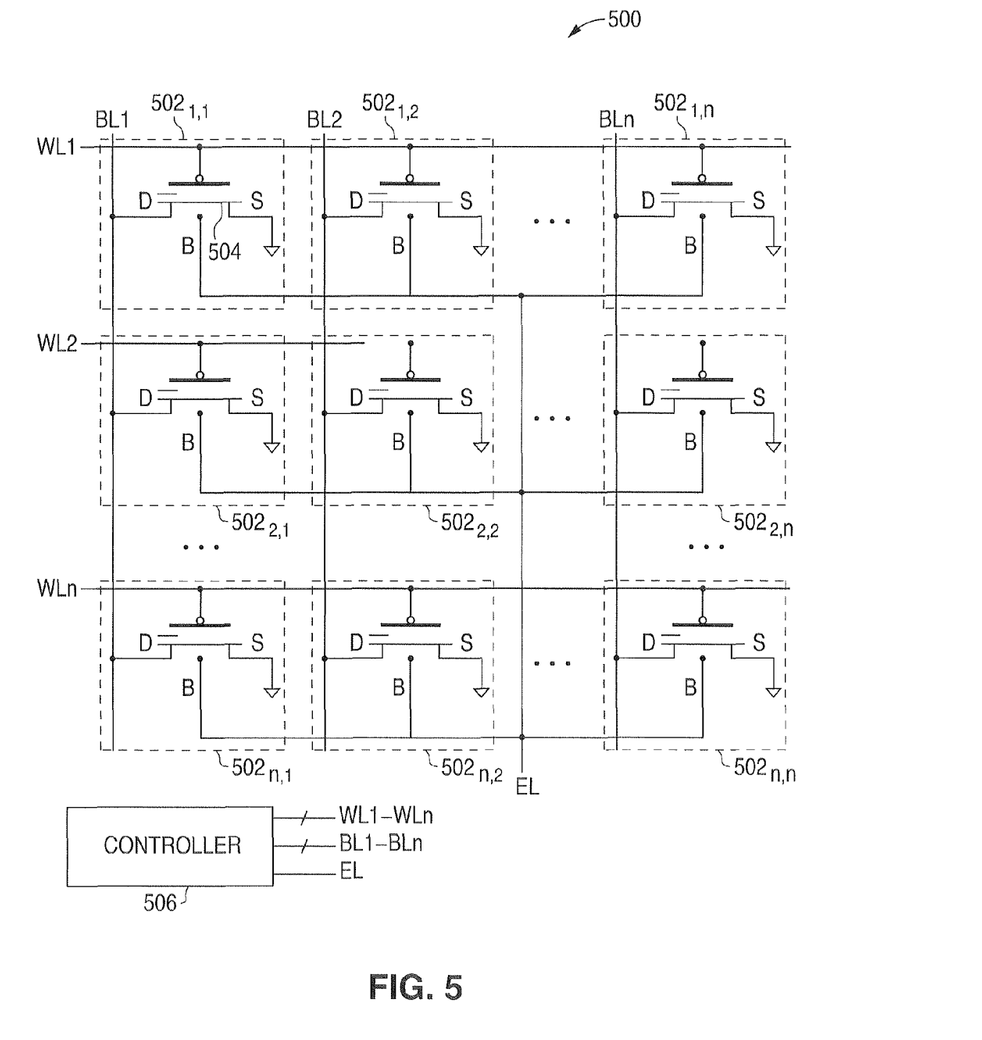
FIG. 5 illustrates an example non-volatile memory cell array according to this disclosure.

FIG. 5 illustrates an example non-volatile memory cell array 500 according to this disclosure. The embodiment of the memory cell array 500 shown in FIG. 5 is for illustration only. Other embodiments of the memory cell array 500 could be used without departing from the scope of this disclosure.

In this example, the memory cell array 500 is formed from various memory cells $502_{1,1}$-$502_{1,n}$, $502_{2,1}$-$502_{2,n}$, . . . $502_{n,1}$-$502_{n,n}$. At least some of the memory cells may be the same as or similar to the memory cell 100 shown in FIG. 1. Each memory cell is coupled to one of multiple word lines (WL1-WLn), one of multiple bit lines (BL1-BLn), and a common erase line (EL). Each memory cell could include a transistor 504 having its source grounded, its drain coupled to one of the bit lines, its control gate coupled to one of the write lines, and its bulk coupled to the erase line. Note that the use of a common erase line is not required, such as when the various memory cells are formed in different wells of the substrate, so the common erase line could be replaced by multiple erase lines (each coupled to one or a subset of the memory cells).

The memory array 500 also includes or is coupled to a controller 506. The controller 506 represents any suitable structure for controlling the operation of the memory cells in the array 500. In this example, the controller 506 is coupled to the word lines, bit lines, and erase line of the array 500 and provides suitable control signals to the lines. This enables the controller 506 to control, for example, the programming, reading, and erasure of the memory cells in the array 500.

In this example, the memory array 500 can be implemented using a NOR-array architecture, which can be highly efficient. Conventional NOR-array architectures suffer from an over-erase failure mechanism. For example, assume both memory cell $502_{1,1}$ and memory cell $502_{2,1}$ have been programmed. During a read operation, a read bias can be applied to bit line BL1. In conventional architectures, both memory cell $502_{1,1}$ and memory cell $502_{2,1}$ could conduct current, making it difficult or impossible to determine the memory state of an individual memory cell $502_{1,1}$ or $502_{2,1}$. In this example embodiment shown in FIG. 5, the control gate in each transistor 504 acts as a select transistor. Regardless of whether the floating gate in a transistor 504 has been programmed, as long as the select transistor is off, little or no channel current is conducted through the transistor 504. If the select transistor of the memory cell $502_{1,1}$ is turned on by applying the appropriate voltage to write line WL1, the current on bit line BL1 may indicate the state of memory cell $502_{1,1}$ correctly without being bothered by other cells.

Any suitable voltage values could be used during the programming, reading, and erasure operations. Example voltages are provided in Table 1, although other suitable voltages could be used depending on the implementation.

TABLE 1

| Operation | Selected Cell's WL | Selected Cell's BL | Unselected Cell's WL | Unselected Cell's BL | Erase |
|---|---|---|---|---|---|
| Program | +5 V | −5 V | 0 V | 0 V | 0 V |
| Erase | 0 V | 0 V | 0 V | 0 V | +12 V |
| Read | −1 V | −1 V | 0 V | 0 V | 0 V |
| Retention | 0 V | 0 V | 0 V | 0 V | 0 V |

Although FIG. 5 illustrates one example of a non-volatile memory cell array 500, various changes may be made to FIG. 5. For example, the memory cell array 500 could have any suitable number of memory cells in any suitable arrangement. As a particular example, while shown as an n×n array, the memory cell array 500 could have any other equal or non-equal dimensions.

Figure 6:
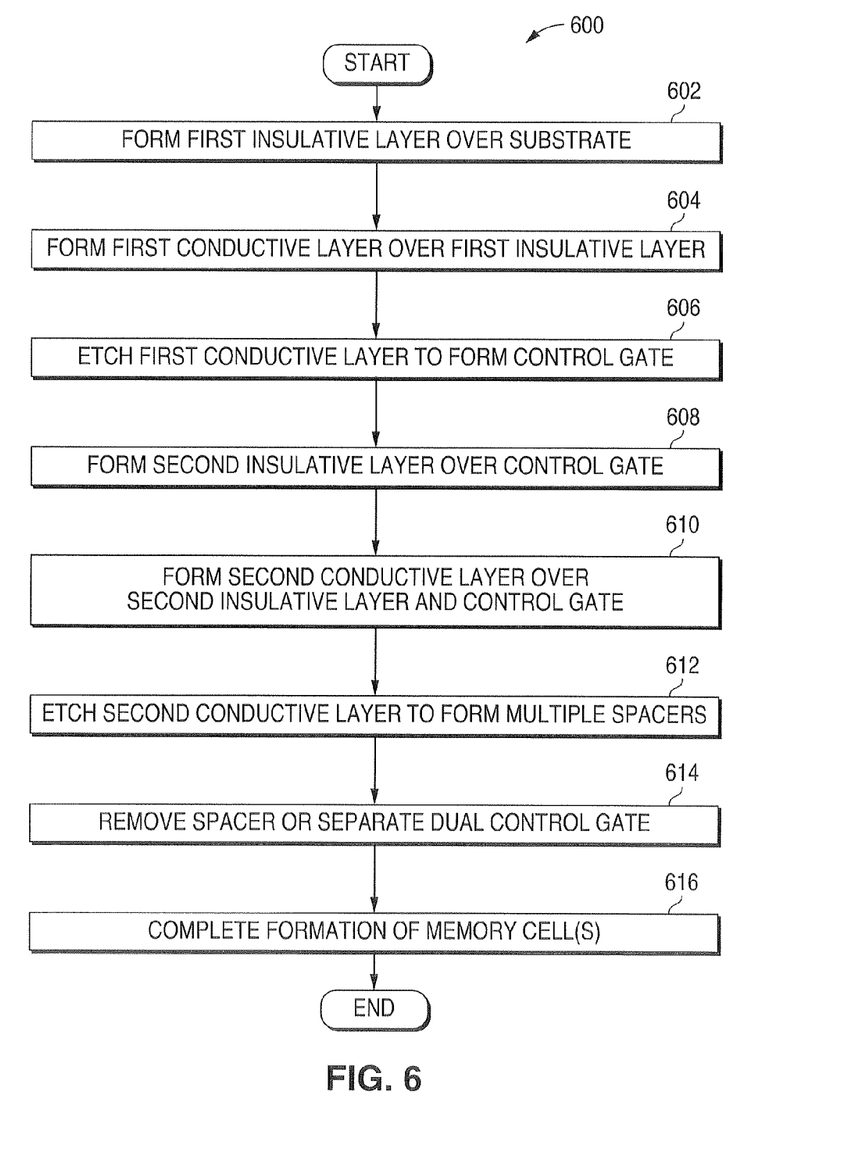
FIG. 6 illustrates an example method for forming non-volatile memory cells according to this disclosure.

FIG. 6 illustrates an example method 600 for forming non-volatile memory cells according to this disclosure. The embodiment of the method 600 shown in FIG. 6 is for illustration only. Other embodiments of the method 600 could be used without departing from the scope of this disclosure.

A first insulative layer is formed over a substrate at step 602. This could include, for example, depositing an oxide over the substrate or oxidizing an exposed surface of the substrate. A first layer of conductive material is deposited over the first insulative layer at step 604. This could include, for example, depositing a layer of polysilicon or other material(s) over the first insulative layer. The first conductive layer is etched to form a control gate at step 606. This could include, for example, depositing a mask on the first conductive layer, patterning the mask, and etching the first conductive layer through the mask. Note that the control gate formed here could represent a single control gate for a single memory cell or a dual control gate for multiple memory cells.

A second insulative layer is formed over at least the control gate at step 608. This could include, for example, depositing an oxide over the control gate or oxidizing an exposed surface of the control gate. This could also include forming the second insulative layer over the substrate, such as by first removing the portion of the first insulative layer that is not between the substrate and the control gate. A second layer of conductive material is deposited over the second insulative layer and the control gate at step 610. This could include, for example, depositing a layer of polysilicon or other material(s) over the second insulative layer and the control gate. The second conductive layer is etched for form multiple spacers at step 612. This could include, for example, depositing a mask on the second conductive layer, patterning the mask, and etching the second conductive layer through the mask. The spacers formed here could include the floating gate for a single transistor or the floating gates for multiple transistors.

One of the spacers is removed or a dual control gate is separated at step 614. In either case, this may include depositing a mask over part or all of the control gate. If one of the spacers is being removed, the mask also covers one of the spacers, while the other spacer remains exposed. If a dual control gate is being separated, the mask covers both spacers, while a portion of the dual control gate remains exposed. An etch can then occur to remove the exposed spacer or to etch away the exposed portion of the dual control gate to form separate control gates.

At this point, the formation of the memory cell(s) is completed at step 616. This could include, for example, forming one or more source and drains junctions in the substrate (and possibly a shared source junction between transistors). This could also include encapsulating the transistor(s) in an encapsulation material and forming electrical connections to write, bit, and erase lines. This could further include performing clean-up steps or any other steps to complete the formation of the memory cell(s).

Although FIG. 6 illustrates one example of a method 600 for forming non-volatile memory cells, various changes may be made to FIG. 6. For example, while shown as a series of steps, various steps in FIG. 6 could overlap, occur in parallel, or occur multiple times. Also, the method 600 could be used to form any number of memory cells, such as memory cells in a memory cell array.

It may be advantageous to set forth definitions of certain words and phrases that have been used within this patent document. The term "couple" and its derivatives refer to any direct or indirect communication between two or more components, whether or not those components are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this invention. Other changes, substitutions, and alterations are also possible without departing from the spirit and scope of this invention as defined by the following claims.

What is claimed is:

1. A method comprising:
    forming a first insulative layer over a semiconductor substrate;
    forming at least one control gate comprising first conductive material over the first insulative layer, each control gate having a bottom surface that contacts the first insulative layer and top and side surfaces;
    forming a second insulative layer over the at least one control gate and over the first insulative layer, the second insulative layer contacting and covering the top and side surfaces of the at least one control gate but not covering the bottom surface of the at least one control gate;

depositing a layer of second conductive material over the second insulative layer; and etching the layer of second conductive material to form multiple spacers adjacent to the at least one control gate, the spacers having a height that is less than a height of the first conductive material forming the at least one control gate, wherein at least one of the spacers forms at least one floating gate in at least one memory cell.

2. The method of claim 1, wherein forming the at least one control gate comprises:

depositing a layer of first conductive material over the first insulative layer; and etching the layer of first conductive material to form the at least one control gate.

3. The method of claim 1, wherein etching the layer of second conductive material forms two spacers adjacent to one control gate.

4. The method of claim 3, further comprising:

forming a mask that covers one of the spacers; and etching another of the spacers, wherein a single memory cell is associated with the one control gate and the remaining spacer.

5. The method of claim 4, further comprising:

forming in the substrate source and drain regions for a transistor associated with the single memory cell.

6. The method of claim 3, further comprising:

forming a mask that covers both of the spacers and a portion of the one control gate; and etching through the one control gate to form multiple separate control gates, wherein each of multiple memory cells is associated with one of the separate control gates and one of the spacers.

7. The method of claim 6, further comprising:

forming in the substrate multiple drain regions and a single shared source region for multiple transistors associated with the multiple memory cells.

8. The method of claim 5, wherein at least part of the floating gate is between the drain region and the one control gate.

9. A method comprising:

forming a control gate comprising first conductive material over a semiconductor substrate, the control gate having bottom, top, and side surfaces;

forming an insulative layer over the control gate, the insulative layer contacting and covering the top and side surfaces of the control gate but not covering the bottom surface of the control gate;

depositing a layer of second conductive material over the insulative layer;

etching the layer of second conductive material to form first and second spacers adjacent to the control gate, the spacers having a height that is less than a height of the first conductive material forming the control gate; and etching the first spacer and a portion of the control gate, leaving the second spacer to form a floating gate;

wherein a single memory cell comprises a remaining portion of the control gate and the floating gate.

10. The method of claim 9, wherein forming the control gate comprises:

depositing a layer of first conductive material over the semiconductor substrate; and etching the layer of first conductive material to form the control gate.

11. The method of claim 9, wherein etching the first spacer and the portion of the control gate comprises:

forming a mask that covers the second spacer and the remaining portion of the control gate.

12. The method of claim 9, further comprising:

forming in the substrate source and drain regions for a transistor associated with the single memory cell.

13. The method of claim 12, wherein at least part of the floating gate is between the drain region and the remaining portion of the control gate.

14. The method of claim 9, further comprising:

forming multiple control gates over the semiconductor substrate;

depositing the layer of second conductive material over the multiple control gates;

etching the layer of second conductive material to form multiple spacers adjacent to each of the control gates; and etching one of the spacers adjacent to each of the control gates and a portion of each of the control gates to form multiple floating gates;

wherein each of multiple memory cells comprises one of the floating gates and a remaining portion of one of the control gates.

15. A method comprising:

forming a first insulative layer over a semiconductor substrate;

forming a control gate comprising first conductive material over the first insulative layer, the control gate having a bottom surface that contacts the first insulative layer and top and side surfaces;

forming a second insulative layer over the control gate and over the first insulative layer, the second insulative layer contacting and covering the top and side surfaces of the control gate but not covering the bottom surface of the control gate;

depositing a layer of second conductive material over the second insulative layer;

etching the layer of second conductive material to form first and second spacers adjacent to the control gate, the spacers having a height that is less than a height of the first conductive material forming the control gate; and etching the first spacer and a portion of the control gate, leaving the second spacer to form a floating gate;

wherein a single memory cell comprises a remaining portion of the control gate and the floating gate.

16. The method of claim 15, wherein forming the control gate comprises:

depositing a layer of first conductive material over the first insulative layer; and etching the layer of first conductive material to form the control gate.

17. The method of claim 15, wherein etching the first spacer and the portion of the control gate comprises:

forming a mask that covers the second spacer and the remaining portion of the control gate.

18. The method of claim 15, further comprising:

forming in the substrate source and drain regions for a transistor associated with the single memory cell.

19. The method of claim 18, wherein at least part of the floating gate is between the drain region and the remaining portion of the control gate.

20. The method of claim 15, further comprising:

forming multiple control gates over the semiconductor substrate;

depositing the layer of second conductive material over the multiple control gates;

etching the layer of second conductive material to form multiple spacers adjacent to each of the control gates; and etching one of the spacers adjacent to each of the control gates and a portion of each of the control gates to form multiple floating gates;

wherein each of multiple memory cells comprises one of the floating gates and a remaining portion of one of the control gates.

* * * * *